(12) United States Patent
Vandel

(10) Patent No.: US 7,332,972 B2
(45) Date of Patent: Feb. 19, 2008

(54) PHASE-LOCKED LOOP CIRCUIT

(75) Inventor: Eric Vandel, Neuchâtel (CH)

(73) Assignee: Semtech Neuchâtel SA, Neuchâtel (CH)

( * ) Notice: Subject to any disclaimer, the term of this patent is extended or adjusted under 35 U.S.C. 154(b) by 0 days.

(21) Appl. No.: 11/367,718

(22) Filed: Mar. 6, 2006

(65) Prior Publication Data
US 2006/0255864 A1   Nov. 16, 2006

Related U.S. Application Data

(63) Continuation of application No. PCT/EP03/09900, filed on Sep. 6, 2003.

(51) Int. Cl.
 *H03B 5/12* (2006.01)
 *H03C 3/22* (2006.01)
 *H03L 7/089* (2006.01)

(52) U.S. Cl. .................. 331/17; 331/16; 331/25; 331/36 C; 331/177 V; 327/157; 332/127; 455/260

(58) Field of Classification Search .......... 331/16–18, 331/25, 36 C, 175, 177 V; 327/156–159; 332/127; 360/51; 375/376; 455/260
See application file for complete search history.

(56) References Cited

U.S. PATENT DOCUMENTS

| 5,727,037 | A | * | 3/1998 | Maneatis ............. 375/376 |
| 5,870,003 | A | * | 2/1999 | Boerstler ............. 331/17 |
| 6,329,882 | B1 | | 12/2001 | Fayneh et al. |
| 2002/0041651 | A1 | | 4/2002 | Schwarzmueller |
| 2002/0075091 | A1 | | 6/2002 | Lo et al. |
| 2006/0255864 | A1 | * | 11/2006 | Vandel ............. 331/16 |
| 2007/0001723 | A1 | * | 1/2007 | Lin ............. 327/156 |

FOREIGN PATENT DOCUMENTS

| EP | 0 780 985 | 12/1996 |
| WO | WO 02/075927 | 9/2002 |

* cited by examiner

*Primary Examiner*—David Mis
(74) *Attorney, Agent, or Firm*—Blank Rome LLP

(57) ABSTRACT

Phase locked loop circuit (105) having a double entry VCO (158) and two independent charge pumps (171, 172), each connected with one of the entries of the VCO. Each of the VCO entries has a different gain coefficient, thereby allowing a better optimisation and control of the device bandwidth and a reduced phase noise. Can be employed in radio transmitters and/or receivers and allows simultaneous and precise FM modulation both inside and outside the PLL bandwidth.

14 Claims, 4 Drawing Sheets

PHASE-LOCKED LOOP CIRCUIT

REFERENCE DATA

This application is a continuation in the USA of international patent application 2003WO-EP09900 (WO0525069), filed on Sep. 6, 2003, the contents whereof are hereby incorporated by reference.

FIELD OF THE INVENTION

The present invention concerns a phase locked loop circuit, and in particular but not exclusively, a PLL generator for application in a frequency synthesizer to be used in a transceiver for a wireless digital communication network.

DESCRIPTION OF RELATED ART

It is known to employ a PLL to generate signals which are in a precise predetermined phase and frequency relation with an input signal, in general with a stabilized reference oscillator. PLL frequency synthesizers are often employed in transceivers used in digital wireless networks, which must be able to generate a variety of closely-spaced channel or local oscillator frequencies with very short channel-switch times. In these very demanding applications the PLL must provide excellent frequency stability, a low level of spurious tones and phase noise and fast locking and switching times.

FIG. 1a represents a typical PLL of type 11. This circuit 3 comprises a phase and frequency comparator 31 for measuring the phase and frequency difference between an input signal REF and the frequency divided output signal 42. The phase and frequency comparator 31 generates the two digital control signals U and D for a charge pump 35 to respectively charge and discharge the loop filter cell 34. The amount of charge generated by the charge pump 35 is for example proportional to the width of the U and D pulses according to a proportionality constant $K_\phi$. The voltage across the filter cell 34 determines the output frequency of the signal OUT at the output of the VCO 36, according to a second proportionality constant $K_{VCO}$. The output signal is fed back to the second input of the comparator 31 via the frequency divider 39, which establishes the ratio between the output frequency and the input reference frequency, to which the output frequency is locked.

U.S. Pat. No. 6,329,882 proposes a self-biased PLL for a timing of a computer system comprising two independent charge pumps, driven by the same phase detector. The signal of the second charge pump is summed to the signal coming from the bias generator for reducing the jitter of the output signal. This document describes a VCO having a single differential input.

U.S. Pat. No. 5,870,003 describes another PLL for a clock of a processor. In this case the VCO has a second, current-sensitive differential input The object of U.S. Pat. No. 6,329,882 and U.S. Pat. No. 5,870,003 is to provide a stable clock for a computer system. The bandwidth of the PLL is not a very critical parameter in this application, and is usually rather low.

Patent application EP780985 describes a circuit comprising a PLL having a phase detector and a double-input VCO one terminal thereof is used for biasing purposes. The bias voltage is provided by a second auxiliary PLL.

U.S. Pat. No. 5,870,003 describes a high-frequency PLL for clocking a computer system having two charge pumps piloting a Delay-Interpolating VCO.

A limitation of the above techniques lies in the large spread and variability of the $K_{VCO}$ parameter which, in the case of a wide tuning range VCO can have a variability up to a factor 5, depending on the VCO input voltage, which induces a variability of the same order in the PLL bandwidth. FIGS. 7c and 7d represent a typical VCO characteristic in which $K_{VCO}$ depends strongly on the control voltage $V_{CTRL}$.

This limitation is further exemplified by the Bode plots of FIGS. 1b and 1c. The plot 1b represents the spread in the open-loop gain in a sample of wide tuning range PLLS. In this case the PLL are equipped with frequency and phase comparators, which induces a second-order type behaviour, but with a considerable gain spread between extreme cases.

The upper limit of the tuning range is approximately given by the open loop unity gain frequency. Plot 1c represents the closed-loop gain for the same sample of PLL. It can be seen that the gain spread directly translates in a large spread in the loop bandwidth.

In order to obviate this limitation it is known to add an A/D converter for sensing the loop filter voltage, which is also the VCO control voltage, in order to adapt the $K_\phi$ gain and maintain a constant $K_\phi \times K_{VCO}$ product in the full PLL dynamic, and therefore a constant bandwidth. A drawback of this solution is the need of A/D and D/A converters, and also a reduced precision in the case of an imperfect $K_{VCO}$ calibration, an increased circuit complexity and compromise between charge-pump noise and current range. This solution, in which $K_{VCO}$ is measured during an auto-calibration sequence, allows a precise bandwidth control, but does not lend itself well to very low-power applications, in which the PLL may be switched repeatedly on and off. Each power cycle implies in fact a new calibration, which is both time- and power-consuming.

PLL bandwidth also affects directly the dynamic behaviour and output phase noise of the PLL. A bandwidth adapted to the application must be high enough to ensure that the PLL can follow the designed frequency variation, but also not too high in order to provide a "flywheel" action for smoothing over noise and jumps in the input signal. Closed loop bandwidth must therefore be strictly controlled especially in the demanding applications of high-speed wireless digital communication.

BRIEF SUMMARY OF THE INVENTION

It is an aim of the present invention to provide a PLL circuit having an improved bandwidth control.

It is likewise an object of the present invention to propose a PLL circuit which is free from the drawback of the related art.

These objects of the present invention are obtained by a device according to the appended independent claim, the dependent claims describing various optional features of the invention. In particular these objects are provided by a phase locking loop circuit, comprising:

a phase and frequency comparator for receiving an input reference signal and a feedback signal;

a voltage controlled oscillator having a first analogue voltage input and a second analogue voltage input, independent from said first analogue voltage input, for controlling a frequency produced from said controlled oscillator;

a first charge pump receiving a signal from said frequency and phase detector and delivering a first control signal to said first voltage input of said voltage controlled oscillator;

a second charge pump receiving a signal from said frequency and phase detector and delivering a second control signal to said second voltage input of said controlled oscillator.

a feedback path, for feeding a correction signal back to said phase and frequency comparator.

BRIEF DESCRIPTION OF THE DRAWINGS

The invention will be better comprised with reference to the accompanying claims and detailed description, illustrated by the figures wherein:

FIG. 3b represents a timing diagram of the detector of FIG. 3a.

DETAILED DESCRIPTION OF THE INVENTION

Figure 2A:
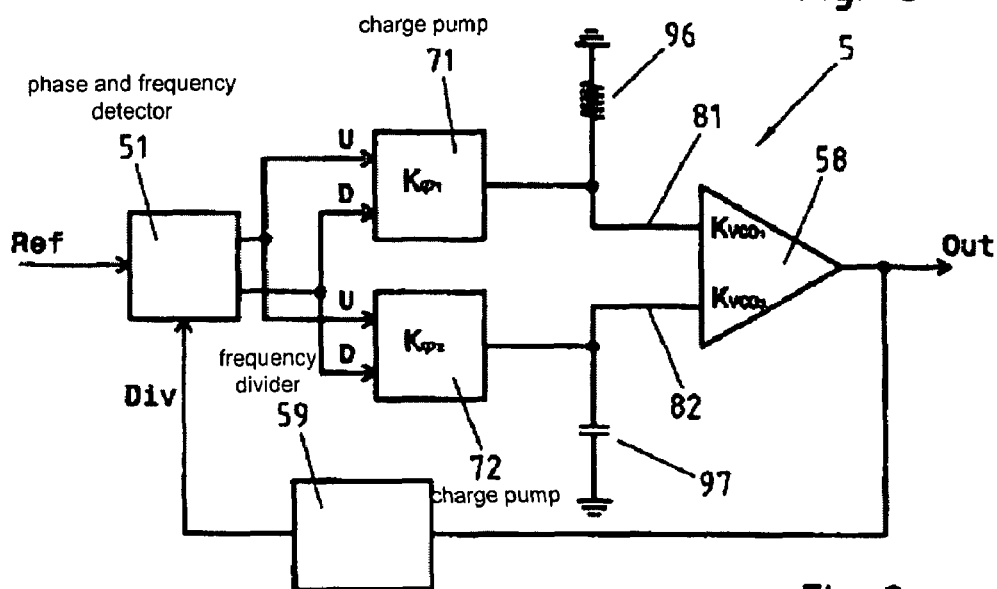
FIG. 2a represents a PLL according to an aspect of the present invention.

FIG. 2 represents a simplified schematic of a PLL 5 according to a first aspect of the present invention. In the circuit of FIG. 2a the input signal REF is fed to a frequency and phase detector 51 which produces two signals U and D, according to the relative phase and frequency differences of the signal present at its two entries. For example the frequency and phase detector 51 could be a known edge-sensitive lead-lag type detector, as illustrated by FIGS. 3a and 3b or any other frequency and phase detector.

Figure 3A:
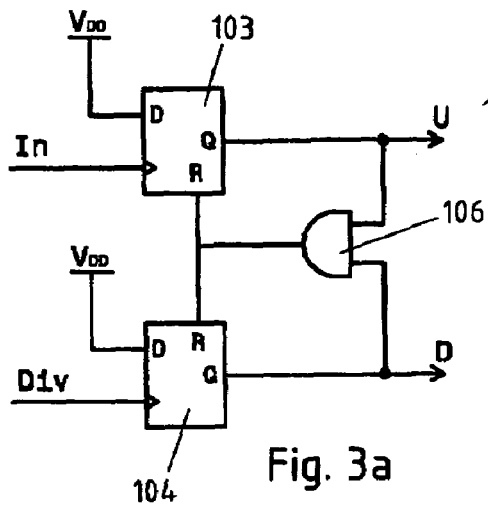
FIG. 3a represents a frequency and phase detector.
Figure 3B:
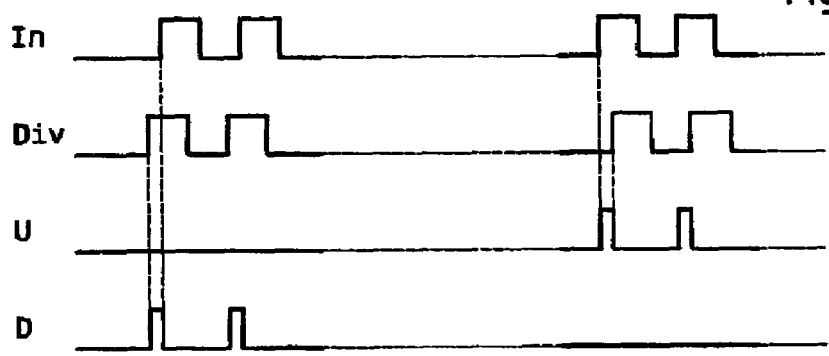

FIG. 3a shows a simplified schematic of an edge sensitive frequency and phase detector 51 suitable for the present invention. The frequency and phase detector 51 comprises in this case two flip-flops 103 and 104 and a logic AND gate 106 arranged in such a way that a voltage pulse is generated at the U output whenever a pulse at the ref input leads ahead a corresponding pulse at the div input. Conversely, whenever the ref input lags behind the div input, pulses are generated at the D output, as it is schematized on FIG. 3b.

Figure 4:
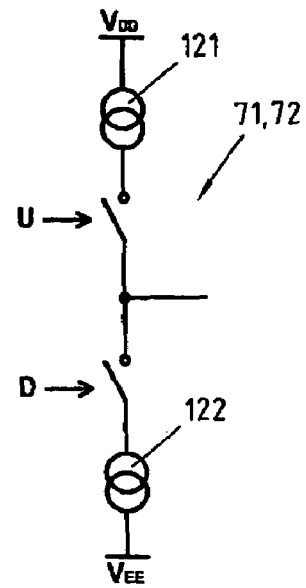
FIG. 4 represents a charge pump.

The signals U and D are then split and fed to the charge pumps 71 and 72, which are now described with reference to FIG. 4 representing a simplified schematic of a charge pump suitable for the present invention. The charge pumps 71 and 72 generate charge pulses whose polarity is positive or negative according to whether a pulse is present at the inputs U or D. Each of the charge pumps 71 and 72 is characterised by a gain coefficient, respectively $K_{\phi 1}$ and $K_{\phi 2}$.

The detector represented on FIG. 3a is used in this possible mode of realization of the present invention. However the skilled person will appreciate that many other types of phase and frequency detectors exist, not limited to two output control signals, which could be replaced to the detector 51 without leaving the scope of the present invention.

Figure 5:
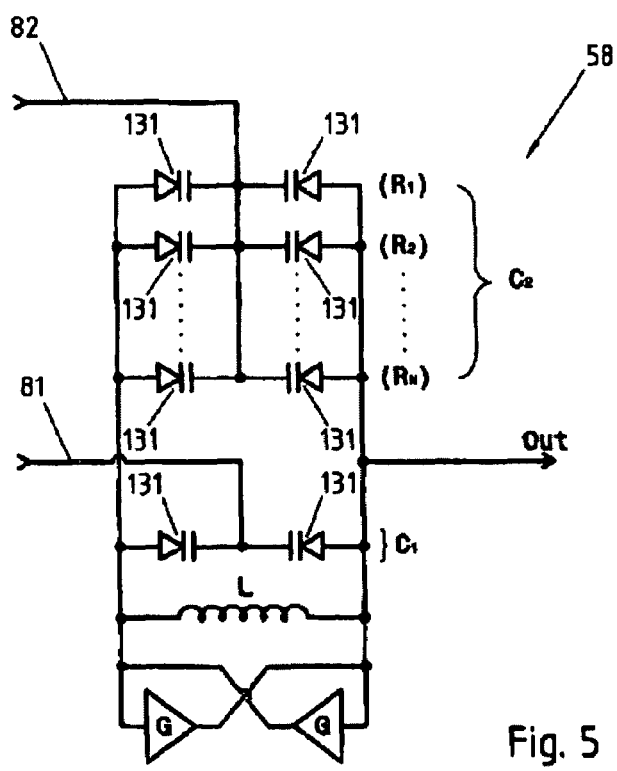
FIG. 5 represents a VCO according to the present invention.

The signals generated by the charge pumps 71 and 72 are finally connected to the dual input VCO (Voltage Controlled Oscillator) 58, which is schematically represented on FIG. 5. The VCO has two analogue control voltage inputs 81 and 82, each of which acts on an array of varactor diodes, modifying the total capacity C seen across the inductor L. The output frequency of such a circuit is given by $F_{OUT}=\frac{1}{2\pi}\sqrt{L\cdot(C_1+C_2)}$. Since the input control voltage 82 is applied to N rows of varactors and the input control voltage 81 is applied to one row only, it follows that, all diodes being identical, the gain $K_{VCO2}$ of the input 82 is N times the gain $K_{VCO1}$ of the input 81, that is: $K_{VCO2}=N\times K_{VCO1}$. It is also possible, within the frame of the present invention, to employ varactor diodes of different characteristics in the different sections of the VCO 58 for providing two variable capacitors having different voltage coefficients.

Even if this particular embodiment of the invention involves an LC oscillator, the invention is not limited to this class of circuit. An equivalent double-input VCO could in fact be obtained by other types of controlled oscillator, for example by a ring oscillator.

By referring now again to FIG. 2a, one can appreciate that the proportional and integral part of the loop filter are split in the device of the invention. The first VCO input 81, which has a lower $K_{VCO1}$, sees the voltage across the resistance 96 and takes care of the proportional part of the control loop, and determines the bandwidth of the PLL. The voltage at the first PLL input 81 is substantially fixed, and, as a result the variations of $K_{VCO1}$ and the spread in PLL bandwidth are greatly reduced.

Figure 7A:
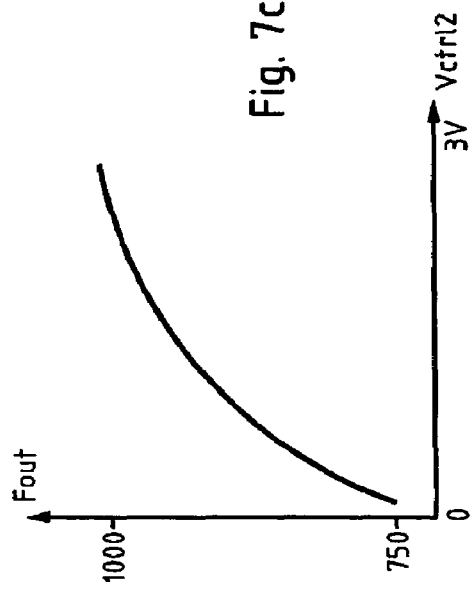
FIGS. 7a-7d shows, in diagrammatical form, the voltage-frequency VCO characteristics of the VCO used in the present invention.
Figure 7C:
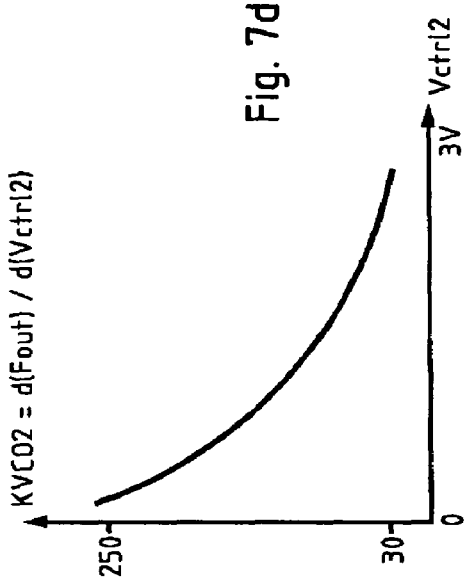
Figure 7B:
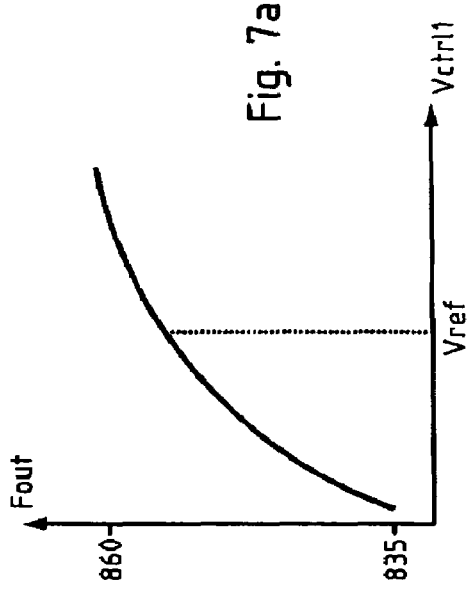

FIGS. 7a and 7b represent the F/V characteristic of the VCO 58 in function of the first control voltage 81. During normal circuit functioning the variations of the control voltage 81 are contained within a relatively narrow range 107. As a consequence variations in $K_{VCO1}$ and in the PLL bandwidth are minimized.

The second VCO input 82 sees the voltage across the filtering capacitor 97, and is used to implement the integral part of the control loop. The $K_{VCO2}$ coefficient varies largely according with the input voltage. Preferably this control voltage at the second VCO input 82 can swing from rail-to-rail. The induced $K_{VCO2}$ variation does not however affect directly the bandwidth of the PLL, which is mainly dependent from $K_{VCO1}$.

Figure 7D:
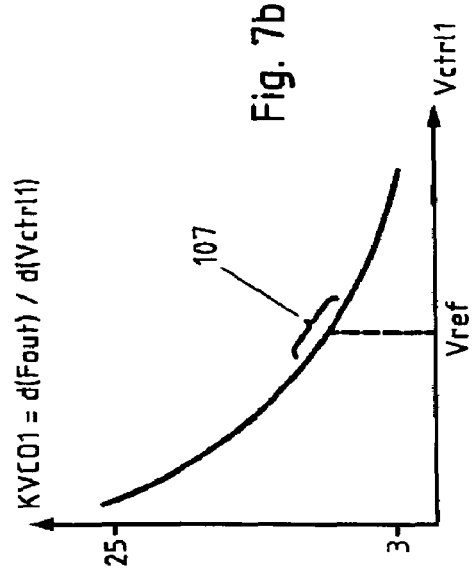

FIGS. 7c and 7d represent the F/V characteristic of the VCO 58 in function of the second control voltage 82.

Figure 1A:
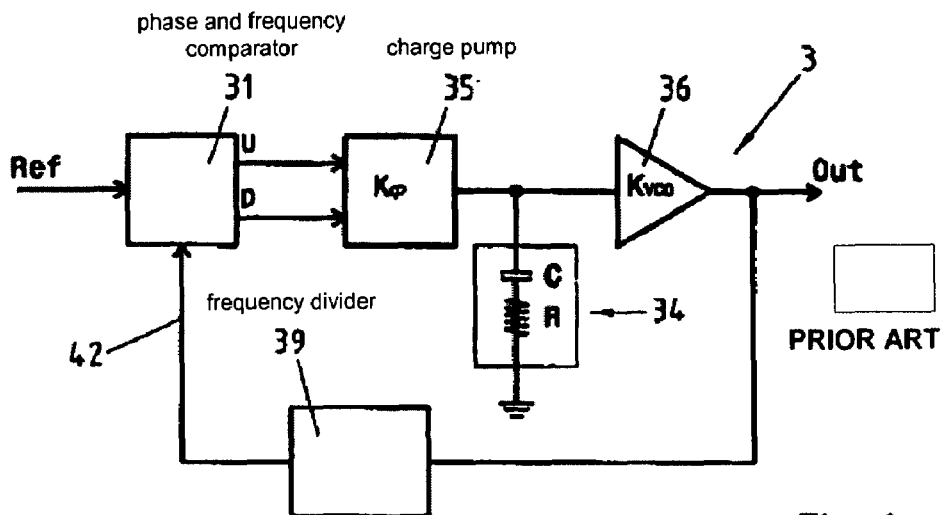
FIG. 1a represents a PLL of conventional type.
Figure 1B:
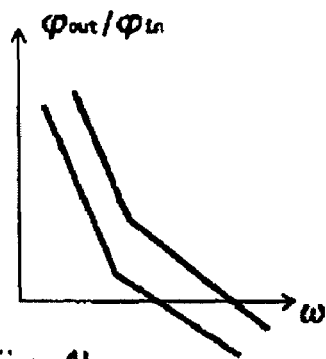
FIGS. 1b and 1c represent the bandwidth of the PLL of FIG. 1a as Bode plots.
Figure 1C:
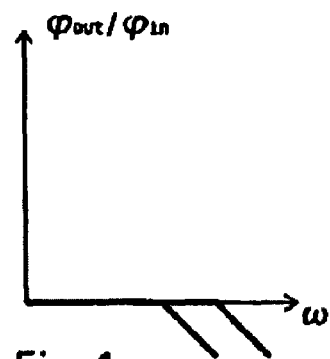
Figure 2B:
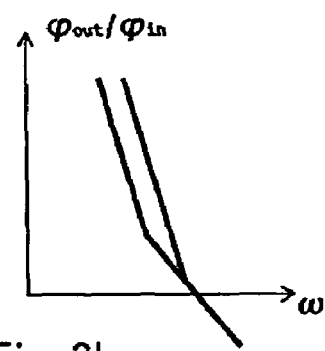
FIGS. 2b and 2c represent the bandwidth of the PLL of FIG. 2a as Bode plots.

This aspect of the invention will be better comprised when comparing the open-loop and closed-loop bandwidth of this circuit with those of conventional PLL of FIGS. 1a, 1b and 1c. FIG. 2b represents the open loop gain of a circuit like the one of FIG. 2a. One can see from the plot of FIG. 2b that the spread in $K_{VCO2}$ translates in a variation of the zero position in the open-loop transfer function. Above this frequency the open-loop gain is dominated by the relatively stable contribution of $K_{\phi 1}$ and $K_{VCO1}$.

Figure 2C:
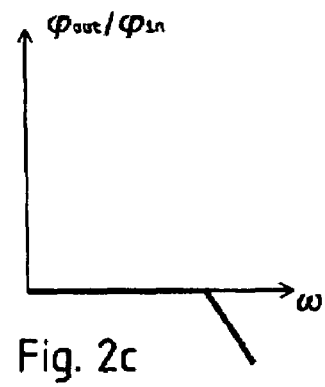

The unity-gain frequency varies therefore very little. The closed-loop bandwidth is thus remarkably stable, as illustrated by the plot of FIG. 2c.

This architecture has also other advantages. In particular the design constraints of the two charge pumps 71 and 72 are rather different, and each of them can be independently optimized. Charge pump 71 needs to have good noise performance, but only a limited output swing. The second charge pump 72, on the contrary should preferably provide rail-to-rail swing, for maximal PLL frequency range, but the noise specification can be somewhat relaxed thanks to the filtering action of capacitor 97.

The contribution of thermal noise of resistor 96 to the output is also reduced, thanks to the low value of the $K_{VCO1}$ factor.

Figure 6:
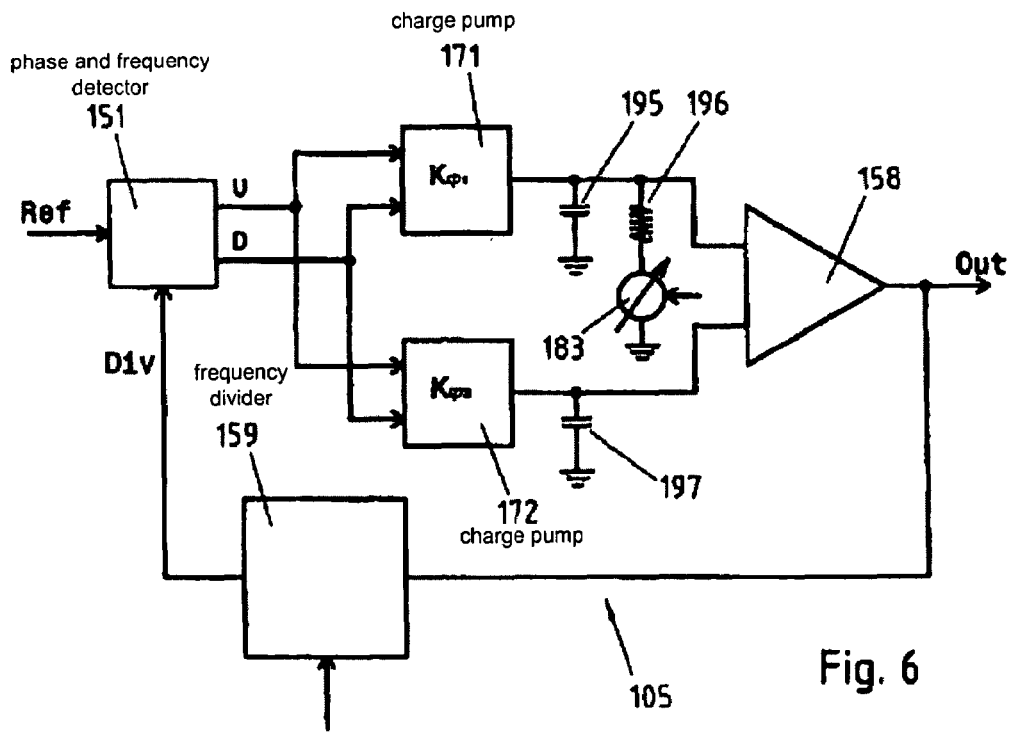
FIG. 6 represents a Frequency synthesizer according to an aspect of the present invention.

FIG. 6 represents a variant embodiment of the present invention. The circuit of FIG. 6 is a frequency synthesizer and modulator which can be employed in a digital radiofrequency transmitter, and in particular in a low-power transmitter for a wireless telecommunication network, like a Bluetooth network, an 802.11 network, a GSM network, a network based on a DECT protocol or the like. The PLL 105 comprises a multiple divider 159 for obtaining a series of output frequencies, each of which is an integer or non-integer multiple of the reference frequency Ref. The multiple divider can foresee a time-switched double ratio divider, a randomized multiple ratio divider, a delta-sigma modulator or any other fractional ratio frequency synthesis technique.

For use in a FM transmitter the circuit includes a variable source 183, which is used for the modulation of the output signal. The skilled person will appreciate that other disposition of the source or modulation schemes are likewise possible within the scope of the present invention. The variable source 183 and the divider 159 are controlled by a digital controlling circuit not represented, allowing a precise FM modulation outside of the PLL bandwidth thanks to the controlled $K_{VCO1}$ (modulation inside PLL bandwidth being assured by digital control).

The same circuit, here illustrated in connection with a transmitter, could also serve as local oscillator in a direct conversion, low IF or heterodyne receiver.

The invention claimed is:

1. A phase locking loop circuit, comprising:
   a phase and frequency detector for receiving an input reference signal, and a feedback signal;
   a voltage controlled oscillator having a first analogue voltage input for controlling a frequency produced from said voltage controlled oscillator according to a first proportionality coefficient and a second analogue voltage input, independent from said first analogue voltage input for controlling a frequency produced from said voltage controlled oscillator according to a second proportionality coefficient, different from said first proportionality coefficient;
   a first charge pump receiving a signal from said frequency and phase detector and delivering a first control signal to said first voltage input of said voltage controlled oscillator;
   a second charge pump receiving a signal from said frequency and phase detector and delivering a second control signal to said second voltage input of said voltage controlled oscillator; and
   a feedback path for feeding a correction signal back to said phase and frequency detector;
   wherein said first charge pump is connected directly to the first voltage input of the voltage controlled oscillator, without a filtering capacitor.

2. The phase locking loop of claim 1, wherein said first voltage input is a low-sensitivity input, whereas said second voltage input is a higher-sensitivity input, for locking said output signal and following said input signal.

3. The phase locking loop circuit of claim 1, wherein said frequency and phase detector has a first output and a second output.

4. The phase locking loop circuit of claim 1, further comprising a capacitor for filtering said second control signal.

5. The phase locking loop circuit of claim 1, wherein said first charge pump has an output dynamics different from an output dynamics of said second charge pump.

6. The phase locking loop circuit of claim 1, further comprising a multiple-ratio divider for generating an output signal whose frequency is in non-integral ratio with a frequency of said input signal.

7. The phase-locking loop circuit of claim 6, further comprising a modulation input, connected with a voltage input of said voltage controlled oscillator.

8. A frequency synthesizer, comprising a PLL circuit according to claim 1.

9. A receiver and/or transmitter circuit, comprising a PLL circuit according to claim 1.

10. A phase locking loop circuit, comprising:
    a phase and frequency detector for receiving an input reference signal, and a feedback signal;
    a voltage controlled oscillator comprising a LC oscillator with varactor diodes, said voltage controlled oscillator having a first analogue voltage input for controlling a frequency produced from said voltage controlled oscillator according to a first proportionality coefficient and a second analogue voltage input, independent from said first analogue voltage input for controlling a frequency produced from said voltage controlled oscillator according to a second proportionality coefficient, different from said first proportionality coefficient;
    a first charge pump receiving a signal from said frequency and phase detector and delivering a first control signal to said first voltage input of said voltage controlled oscillator;
    a second charge pump receiving a signal from said frequency and phase detector and delivering a second control signal to said second voltage input of said voltage controlled oscillator; and
    a feedback path for feeding a correction signal back to said phase and frequency detector;
    wherein said first charge pump is connected directly to the first voltage input of the voltage controlled oscillator, without a filtering capacitor.

11. The phase locking loop circuit of claim 10, wherein said voltage controlled oscillator is a LC oscillator comprising an array of parallel-connected varactor diodes and providing two variable capacitors having different voltage coefficients.

12. A phase locking loop circuit, comprising:
    a phase and frequency detector for receiving an input reference signal, and a feedback signal;
    a voltage controlled oscillator having a first analogue voltage input for controlling a frequency produced from said voltage controlled oscillator according to a first proportionality coefficient and a second analogue voltage input, independent from said first analogue voltage input for controlling a frequency produced from said voltage controlled oscillator according to a second proportionality coefficient, different from said first proportionality coefficient;
    a first charge pump receiving a signal from said frequency and phase detector and delivering a first control signal to said first voltage input of said voltage controlled oscillator;
    a second charge pump receiving a signal from said frequency and phase detector and delivering a second control signal to said second voltage input of said voltage controlled oscillator;
    a feedback path for feeding a correction signal back to said phase and frequency detector; and a variable modulation source, for generating a modulation signal, that is composed with said first control signal at said first voltage input of the voltage controlled oscillator.

13. The phase locking loop circuit of claim 12, further comprising a multiple-ratio divider for generating an output signal whose frequency is in non-integral ratio with a frequency of said input signal.

14. A receiver and/or transmitter circuit, comprising a PLL circuit according to claim 12.

* * * * *